(12) United States Patent
Chen et al.

(10) Patent No.: US 11,894,243 B2
(45) Date of Patent: Feb. 6, 2024

(54) WAFER SYSTEM-LEVEL FAN-OUT PACKAGING STRUCTURE AND MANUFACTURING METHOD

(71) Applicant: SJ SEMICONDUCTOR (JIANGYIN) CORPORATION, Jiangyin (CN)

(72) Inventors: Yenheng Chen, Jiangyin (CN); Chengchung Lin, Jiangyin (CN)

(73) Assignee: SJ SEMICONDUCTOR (JIANGYIN) CORPORATION, Jiangyin (CN)

( * ) Notice: Subject to any disclaimer, the term of this patent is extended or adjusted under 35 U.S.C. 154(b) by 250 days.

(21) Appl. No.: 17/531,609

(22) Filed: Nov. 19, 2021

(65) Prior Publication Data

US 2022/0165586 A1 May 26, 2022

(30) Foreign Application Priority Data

Nov. 20, 2020 (CN) .......................... 202011310599.0
Nov. 20, 2020 (CN) .......................... 202022718472.4

(51) Int. Cl.
*H01L 21/56* (2006.01)
*H01L 23/498* (2006.01)
*H01L 23/00* (2006.01)

(52) U.S. Cl.
CPC ...... *H01L 21/568* (2013.01); *H01L 23/49816* (2013.01); *H01L 24/19* (2013.01); *H01L 2224/04105* (2013.01); *H01L 2224/12105* (2013.01); *H01L 2224/73267* (2013.01)

(58) Field of Classification Search
CPC . H01L 21/568; H01L 23/49816; H01L 24/19; H01L 2224/04105; H01L 2224/12105; H01L 2224/73267
See application file for complete search history.

(56) References Cited

U.S. PATENT DOCUMENTS

| 2019/0139896 | A1* | 5/2019 | Hsu | .......................... H01L 24/19 |
| 2021/0013053 | A1* | 1/2021 | Tsai | ..................... H01L 23/5389 |
| 2021/0020574 | A1* | 1/2021 | Yu | ....................... H01L 25/0652 |
| 2021/0305228 | A1* | 9/2021 | Yang | ................. H01L 23/49816 |

* cited by examiner

*Primary Examiner* — Fernando L Toledo
*Assistant Examiner* — Neil R Prasad
(74) *Attorney, Agent, or Firm* — Alston & Bird LLP (57) ABSTRACT

A wafer system-level fan-out packaging structure and a manufacturing method. The method includes: forming a redistribution layer, where the redistribution layer includes a first surface and an opposite second surface; providing a patch element, and bonding the patch element to the second surface; providing a die having a bump disposed on a front side, and bonding the front side of the die to the second surface of the redistribution layer through the bump; and forming a plastic packaging layer on the second surface of the redistribution layer, where the plastic packaging layer covers the patch element, back side and side surfaces of the die. In the wafer system-level fan-out packaging structure and the manufacturing method of the present disclosure, the die and the patch element are packaged in a plastic packaging layer, and the die and the patch element are connected and let out by the redistribution layer.

11 Claims, 6 Drawing Sheets

WAFER SYSTEM-LEVEL FAN-OUT PACKAGING STRUCTURE AND MANUFACTURING METHOD

CROSS REFERENCE TO RELATED APPLICATIONS

The present application claims the benefit of priority to Chinese Patent Application No. CN 2020113105990, entitled "WAFER SYSTEM-LEVEL FAN-OUT PACKAGING STRUCTURE AND MANUFACTURING METHOD", and Chinese Patent Application No. CN202022718472.4, entitled "WAFER SYSTEM-LEVEL FAN-OUT PACKAGING STRUCTURE", both filed with CNIPA on Nov. 20, 2020, the disclosures of which are incorporated herein by reference in their entirety for all purposes.

FIELD OF TECHNOLOGY

The present disclosure relates to the field of semiconductor packaging, in particular, relates to a wafer system-level fan-out packaging structure and a manufacturing method.

BACKGROUND

The 5th generation (5G) chips for communication and artificial intelligence (AI) transmit and process interactively enormous amounts of data at high speed. Such chips usually include a huge number of pads (hundreds or even thousands for each chip) as well as ultra-small pin sizes and pin-spacings (a few microns or even smaller). At the same time, requirements generated by the mobile Internet and the Internet of Things (IoT) are increasingly demanding. Miniaturization and multi-functionalization of electronic end products are trends in the industry. Therefore, it has become a challenge in the field of advanced semiconductor chip packaging technology to integrate a plurality of high-density chips of different types to form a powerful system or sub-system which has a relatively small size and relatively low power consumption. At present time, high-density integrated multi-chip packaging is typically performed in the industry by using through-silicon-via (TSV) technology, silicon interposers (Si), or the like. By applying these techniques, ultra-small pins are led out from the chips and effectively connected to form a functional module or system. However, these technologies are relatively costly, significantly limiting their application scopes.

With the constant demand for higher functionality, better performance, greater energy efficiency, lower manufacturing costs, and smaller sizes, the fan-out packaging technology provides a good platform for integrated multi-chip packaging through wafer reconstruction and rewiring. However, in existing fan-out packaging technologies, the packages have a relatively large area and a relatively large thickness due to limited precision of wiring, and there are other problems such as complex procedures and low reliability.

To meet the development trend of multi-function, miniaturization, portability, high speed, low power consumption and high reliability of microelectronic packaging technology, System In Package (SIP) technology, as an emerging heterogeneous integration technology, has become the packaging platform for more chips. SIP is the integration of multiple functional chips and components into one package to achieve a complete function. SIP is a new packaging technology with the advantages of shorter development cycle, more functions, lower power consumption, better performance, lower cost and price, smaller size, and lower mass.

However, with the increasing demand for package components and functions, the existing SIP will occupy more area and vertical space, thus bigger volume, which is not conducive to a higher integration level.

SUMMARY

The present disclosure provides a method for manufacturing a wafer system-level fan-out packaging structure. The method includes:
  providing a first carrier substrate and a release layer on the first carrier substrate;
  forming a redistribution layer, wherein the redistribution layer comprises a first surface and a second surface opposite to each other;
  bonding a patch element to the second surface of the redistribution layer;
  providing a die having a bump disposed on a front side, and bonding the front side of the die to the second surface of the redistribution layer by the bump; and
  forming a plastic packaging layer on the second surface of the redistribution layer, wherein the plastic packaging layer covers the patch element, a back side and side surfaces of the die.

Optionally, the first surface of the redistribution layer is placed on the release layer.

Optionally, the method further comprises:
  providing a second carrier substrate;
  bonding the second carrier substrate to the plastic packaging layer; and
  removing the first carrier substrate and the release layer to expose the first surface of the redistribution layer.

Optionally, the method further comprises:
  forming an under-bump-metallization layer on the first surface of the redistribution layer;
  forming a solder bump on the under-bump-metallization layer; and
  removing the second carrier substrate.

Optionally, the method further comprises: trimming the redistribution layer and the plastic packaging layer to obtain the plurality of chips.

Optionally, the method further comprises-: forming an under-fill layer in the gap between the die and the second surface of the redistribution layer.

Optionally, the redistribution layer comprises at least one dielectric layer and at least one metal distribution layer that are stacked in a vertical direction.

Optionally, the patch element comprises an electronic passive element.

The present disclosure provides a wafer system-level fan-out packaging structure. The structure comprises:
  a redistribution layer, comprising a first surface and a second surface opposite to each other;
  a patch element, bonded to the second surface of the redistribution layer;
  a die having a bump disposed on a front side, wherein the front side of the die is bonded to the second surface of the redistribution layer; and
  a plastic packaging layer, disposed on the second surface of the redistribution layer wherein the plastic packaging layer covers the at least one patch element, a back side of the die and side surfaces of the die.

Optionally, the structure further comprises an under-bump-metallization layer and a solder bump. The underbump-metallization layer is located on the first surface of the redistribution layer, and the solder bump is bonded to the under-bump-metallization layer.

Optionally, the structure further comprises an under-fill layer located in a gap between the die and the second surface of the redistribution layer.

Optionally, the redistribution layer comprises at least one dielectric layer and at least one metal distribution layer that are stacked in a vertical direction.

Optionally, the patch element comprises an electronic passive element, including one of a resistor, an inductor, and a capacitor.

In the wafer system-level fan-out packaging structure and the manufacturing method therefor according to the present disclosure, the die and the patch element are packaged in a plastic packaging layer, and the connection and lead-out of the die and the patch element are realized by the redistribution layer. Therefore, the integration of fan-out functions is increased, the function and the efficiency of a single chip enhanced, and the volume optimized.

DETAILED DESCRIPTION

Implementations of the present disclosure are described as follows through specific embodiments, and a person skilled in the art may easily understand other advantages and effects of the present disclosure from the content disclosed in this specification. The present disclosure may also be implemented or applied through another different specific implementation, and any modification or variation may be made to each detail in this specification based on different opinions and applications without departing from the spirit of the present disclosure.

Referring to FIG. 1 to FIG. 14, it should be noted that the illustrations provided in this embodiment only illustrate the basic idea of the present disclosure in a schematic manner. The drawings only show components related to the present disclosure, and the components are not necessarily drawn according to the number, shape, and size of the components in actual implementation. In actual implementation, the type, quantity, and ratio of the components may be changed as needed, and the layout of the components may also be more complex.

Figure 1:
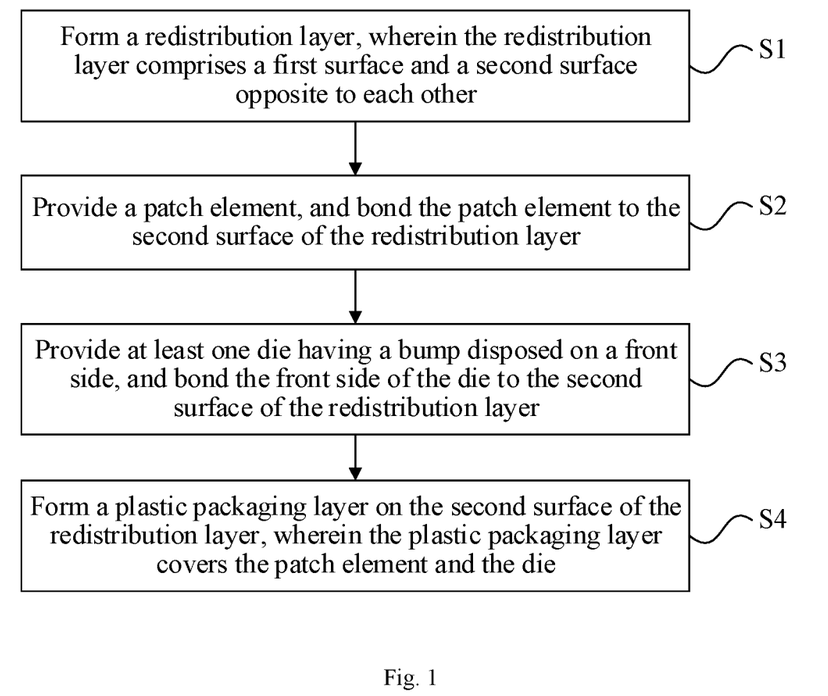
FIG. 1 is a flowchart of a method for manufacturing a wafer system-level fan-out packaging structure according to the present disclosure.

Embodiments of the present disclosure provide a method for manufacturing a wafer system-level fan-out packaging structure. FIG. 1 is a flowchart of the method. The method comprises the following steps: 1

S1: Provide a carrier substrate and a release layer on the carrier substrate, and form a redistribution layer on the release layer, wherein the redistribution layer comprises a first surface and a second surface opposite to each other.

S2: Provide at least one patch element, and bond the patch element to the second surface of the redistribution layer.

S3: Provide at least one die, a front side of the die faces down toward the second surface of the redistribution layer, the die has a bump disposed on its front side, and bond the bumps of the front side of the die to the patch element on the second surface of the redistribution layer.

S4: Form a plastic packaging layer on the second surface of the redistribution layer, wherein the plastic packaging layer covers the die's back side, side surfaces, and the patch element.

Figure 2:
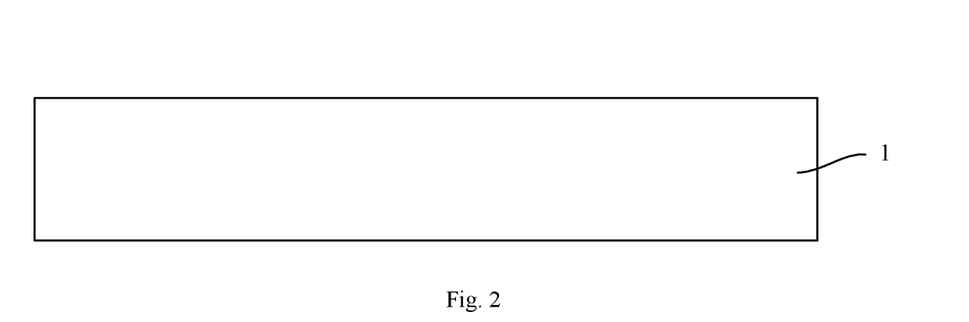
FIG. 2 is a schematic diagram showing a step of providing a first carrier substrate in the method for manufacturing a wafer system-level fan-out packaging structure according to the present disclosure.
Figure 4:
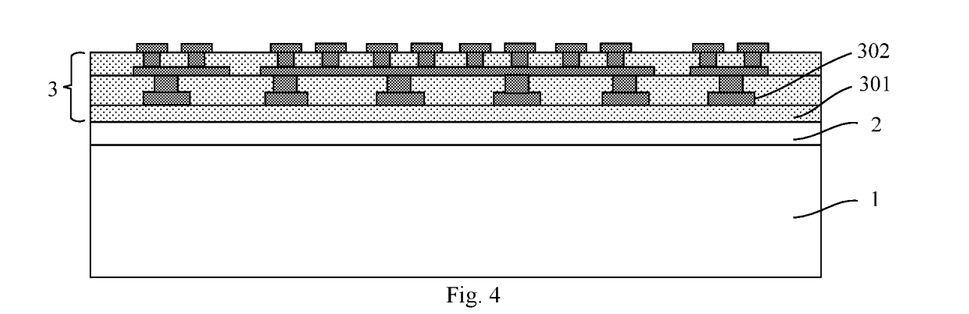
FIG. 4 is a schematic diagram showing a step of forming a redistribution layer on the release layer in the method for manufacturing the wafer system-level fan-out packaging structure according to the present disclosure.

Referring to FIG. 2 and FIG. 4, step S1 is performed, in which a redistribution layer is formed, wherein the redistribution layer comprises a first surface and a second surface opposite to each other.

Specifically, as shown in FIG. 2, a first carrier substrate 1 is provided first. The first carrier substrate 1 is configured to prevent the layer structure from cracking, warping, or breaking during packaging. The first carrier substrate 1 may be a wafer, a panel, or of other desired shapes. The first carrier substrate is made of materials that include, but are not limited to, one of glass, metal, semiconductors, polymers, and ceramics. In one embodiment, the first carrier substrate 1 is made of glass, which has a lower cost, facilitates subsequent formation of a release layer on a surface of the first carrier substrate 1, and can reduce the difficulty of a subsequent peeling process.

Figure 3:
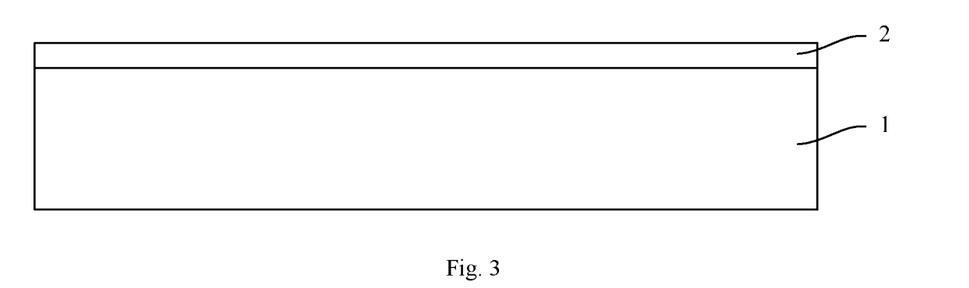
FIG. 3 is a schematic diagram showing a step of forming a release layer on the first carrier substrate in the method for manufacturing the wafer system-level fan-out packaging structure according to the present disclosure.

As shown in FIG. 3, a release layer 2 is formed on the first carrier substrate 1. The release layer 2 may be made of materials such as a tape or a polymer, and may be cured by ultraviolet light or heat.

As shown in FIG. 4, the redistribution layer 3 is formed on the release layer, and the first surface of the redistribution layer 3 is connected to the release layer 2.

For example, the redistribution layer 3 comprises at least one dielectric layer 301 and at least one metal distribution layer 302 that are stacked in a vertical direction.

For example, the redistribution layer 3 is manufactured by the following steps:

(1) A first dielectric layer is formed on a surface of the release layer by chemical vapor deposition, physical vapor deposition, or other suitable processes. A material of the first dielectric layer includes, but is not limited to, one of or a combination of two or more of epoxy resin, silica gel, polyimide (PI), polybenzoxazole (PBO), benzocyclobutene (BCB), silicon oxide, phosphosilicate glass, and fluorine-containing glass. In one embodiment, the first dielectric layer is made of PI to further reduce the process difficulty and the process cost.

(2) A first metal layer is formed on a surface of the first dielectric layer by sputtering, electroplating, chemical plating, or other suitable processes, and is etched to form a patterned first metal distribution layer. A material of the first metal distribution layer comprises one or more of copper, aluminum, nickel, gold, silver, and titanium.

(3) A second dielectric layer is formed on the surface of the patterned first metal distribution layer by chemical vapor deposition, physical vapor deposition, or other suitable processes, and is etched to form a second dielectric layer having a patterned via. A material of the second dielectric layer includes, but is not limited to, one or more of epoxy resin, silica gel, PI, PBO, BCB, silicon oxide, phosphosilicate glass, and fluorine-containing glass. In one embodiment, the second dielectric layer is made of PI to further reduce the process difficulty and the process cost.

(4) A conductive plug is filled in the patterned via by sputtering, electroplating, chemical plating, or other suitable processes, and a second metal layer is formed on a surface of the second dielectric layer by sputtering, electroplating, chemical plating, or other suitable processes, and is etched to form a patterned second metal distribution layer. A material of the second metal distribution layer includes, but is not limited to, one or more of copper, aluminum, nickel, gold, silver, and titanium.

Next, the foregoing steps (3) to (4) may be repeated one or more times as desired to form a redistribution layer having a multilayer stack structure to achieve different distribution functions. For example, in one embodiment, the redistribution layer 3 further comprises a patterned third dielectric layer and a patterned third metal distribution layer.

Figure 5:
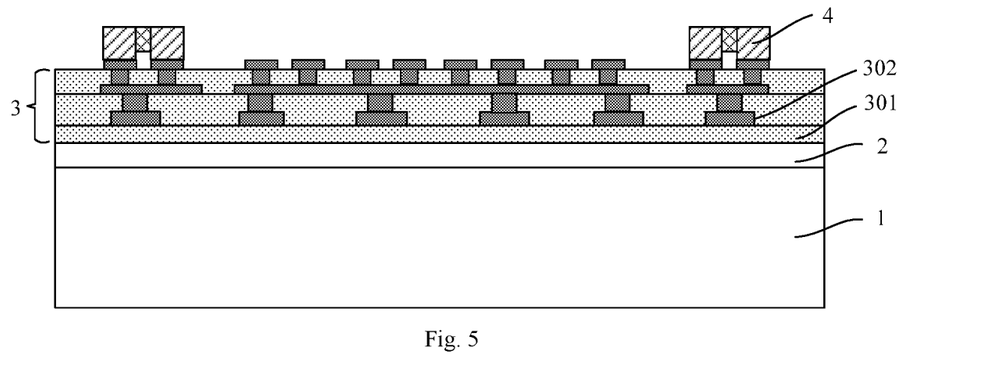
FIG. 5 is a schematic diagram showing a step of providing at least one patch element and bonding the patch element to a second surface of the redistribution layer in the method for manufacturing the wafer system-level fan-out packaging structure according to the present disclosure.

Referring to FIG. 5, step S2 is performed, in which at least one patch element 4 is provided, and the patch element 4 is bonded to the second surface of the redistribution layer 3.

For example, the patch element 4 comprises passive elements such as a resistor, an inductor, or a capacitor. The patch element may be bonded to the second surface of the redistribution layer 3 by a surface mount process to achieve electrical connection to the redistribution layer 3.

Figure 6:
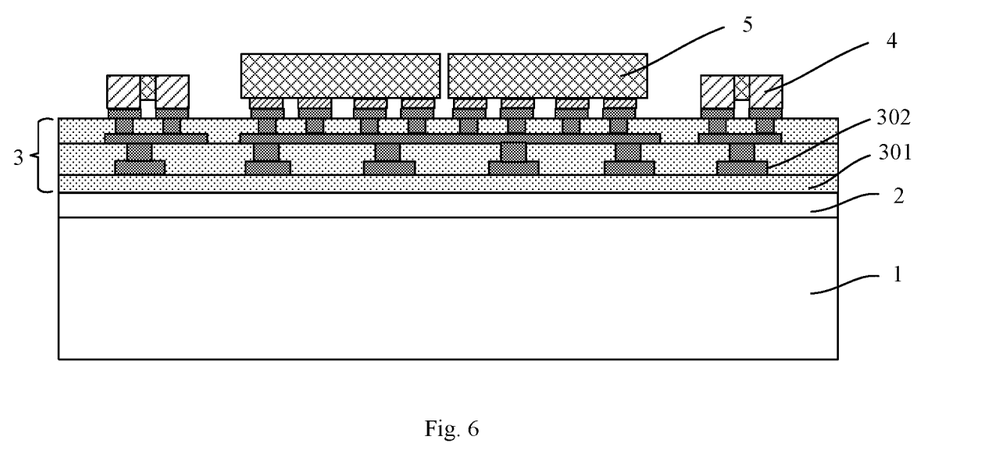
FIG. 6 is a schematic diagram showing a step of providing at least one die having a bump disposed on a front side and bonding the front side of the die to the second surface of the redistribution layer in the method for manufacturing a wafer system-level fan-out packaging structure according to the present disclosure.

Referring to FIG. 6, step S3 is performed, in which at least one die 5 is provided which has a bump disposed on its front side, and the front side of the die 5 faces to the second surface of the redistribution layer 3, and is bonded to the second surface of the redistribution layer 3.

For example, the die may be bonded through its bump to the second surface of the redistribution layer 3 by bond-on-trace. The die 5 may have a substrate or more circuits inside. The type and number of the die 5 may be varied as needed. A material of the bump of the die includes, but is not limited to, copper, nickel, tin, and silver.

Figure 7:
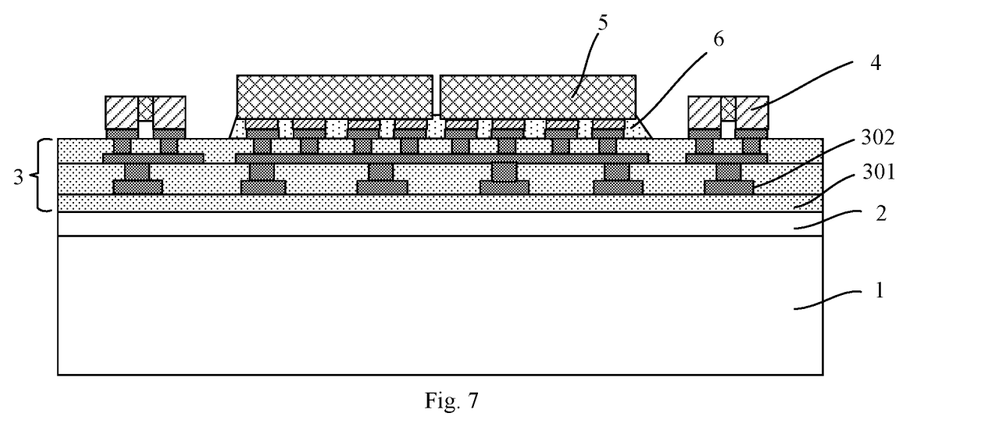
FIG. 7 is a schematic diagram showing a step of forming an under-fill layer in a gap between the dies and the redistribution layer in the method for manufacturing a wafer system-level fan-out packaging structure according to the present disclosure.

For example, as shown in FIG. 7, an under-fill layer 6 may be further formed in the gap between the die 5 and the redistribution layer 3 by dispensing injection or other suitable processes. The under-fill layer 6 provides protection for the connection between the die 5 and the redistribution layer 3 to prevent corrosion or connection damage, and enhances the bonding performance of the die 5 and the redistribution layer 3 and improves the mechanical strength.

Figure 8:
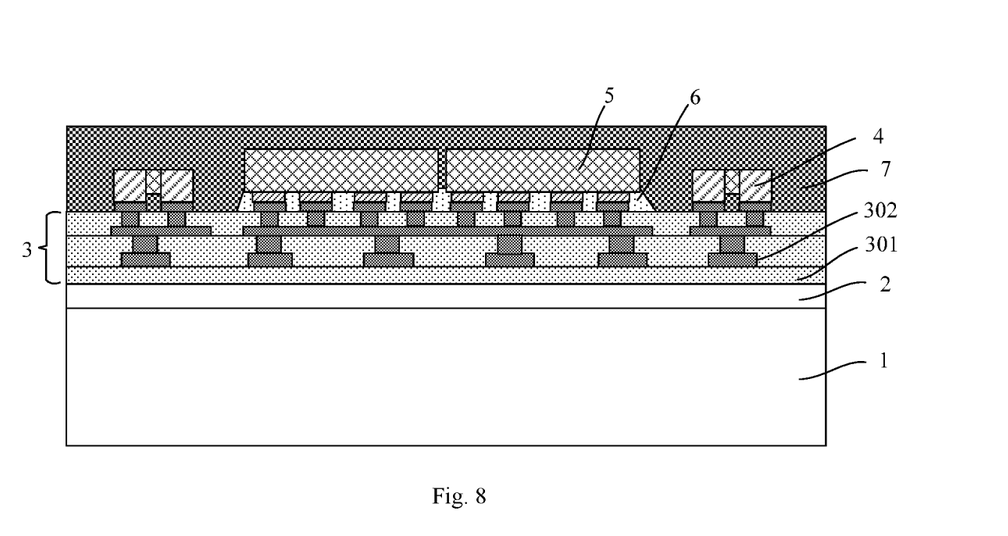
FIG. 8 is a schematic diagram showing a step of forming a plastic packaging layer on the second surface of the redistribution layer in the method for manufacturing the wafer system-level fan-out packaging structure according to the present disclosure.

Referring to FIG. 8, step S4 is performed, in which a plastic packaging layer 7 is formed on the second surface of the redistribution layer, wherein the plastic packaging layer 7 covers the patch element 4 and the top side and side surfaces of the die 5.

For example, a method for forming the plastic packaging layer 7 includes, but is not limited to, any of compression molding, transfer molding, liquid sealing, vacuum lamination, and spin coating. The plastic packaging layer 7 may be made of a curable material, such as a polymer-based material, a resin-based material, polyamide, epoxy resin, or any combination thereof.

Figure 9:
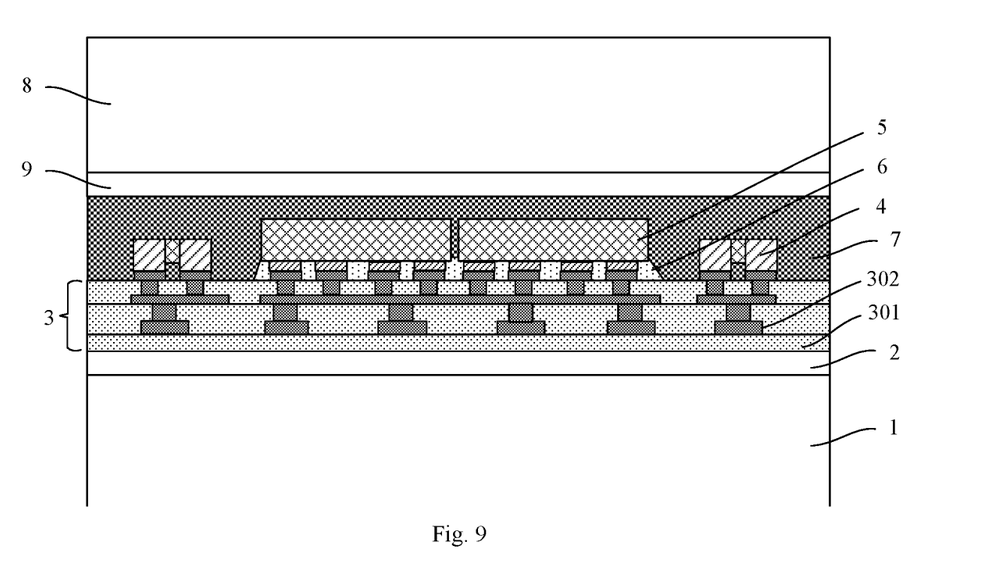
FIG. 9 is a schematic diagram showing a step of providing a second carrier substrate and bonding the second carrier substrate over the plastic packaging layer in the method for manufacturing the wafer system-level fan-out packaging structure according to the present disclosure.

For example, as shown in FIG. 9, a second carrier substrate 8 is further provided, and the second carrier substrate 8 is bonded to the plastic packaging layer 7.

For example, the second carrier substrate 8 may be bonded to the plastic packaging layer 7 by one or another suitable adhesion layer 9. A material of the second carrier substrate 8 includes, but is not limited to, one of glass, metal, semiconductor, a polymer, and ceramics.

Figure 10:
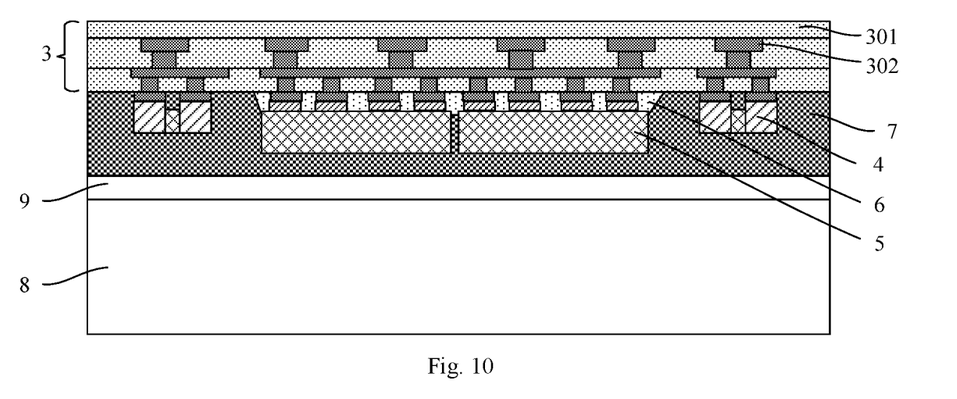
FIG. 10 is a schematic diagram showing a step of removing the first carrier substrate and the release layer to expose the first surface of the redistribution layer in the method for manufacturing the wafer system-level fan-out packaging structure according to the present disclosure.

For example, as shown in FIG. 10, the first carrier substrate 1 and the release layer 2 are removed to expose the first surface of the redistribution layer 3.

Specifically, first the viscosity of the release layer 2 is reduced by a corresponding method according to the type of the release layer 2, and then the first carrier substrate 1 and the release layer 2 are peeled off. For example, when the release layer 2 uses a photothermal conversion material, the photothermal conversion layer may be irradiated with a laser to separate the photothermal conversion layer from the redistribution layer 3 and the first carrier substrate 1.

Figure 11:
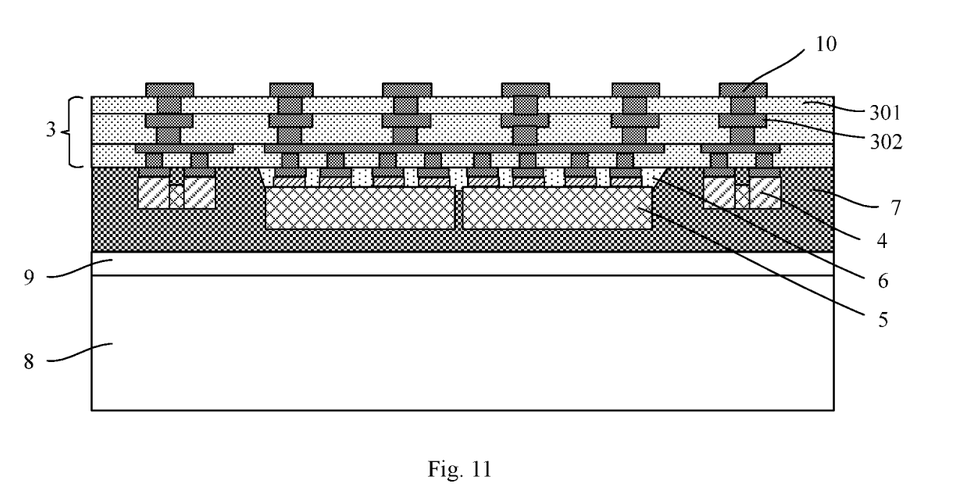
FIG. 11 is a schematic diagram showing a step of forming an under-bump-metallization layer on the first surface of the redistribution layer in the method for manufacturing the wafer system-level fan-out packaging structure according to the present disclosure.

For example, as shown in FIG. 11, an under-bump-metallization layer 10 is further formed on the first surface of the redistribution layer 3.

In this embodiment, a window may be first formed in the first dielectric layer by a laser, wherein the first metal distribution layer is exposed from the window. Then the under-bump-metallization layer 10 is manufactured in and near the window. A material of the under-bump-metallization layer 10 comprises, but is not limited to, copper, nickel, tin, and silver.

Figure 12:
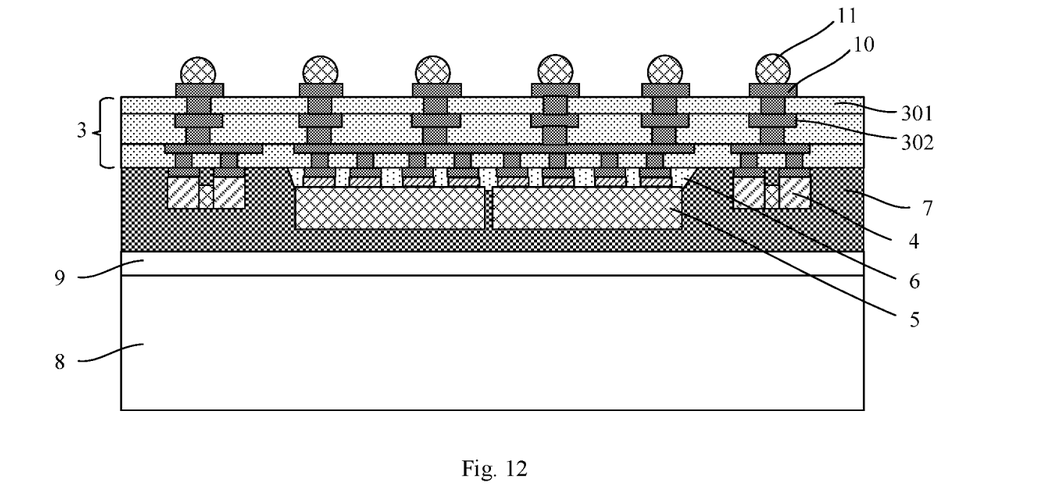
FIG. 12 is a schematic diagram showing a step of forming solder bumps on the under-bump-metallization layer in the method for manufacturing the wafer system-level fan-out packaging structure according to the present disclosure.

For example, as shown in FIG. 12, solder bumps 11 are further formed on the under-bump-metallization layer 10. The solder bump 11 may be composed of a metal pillar and a solder joint, or may be composed of only a solder ball.

Figure 13:
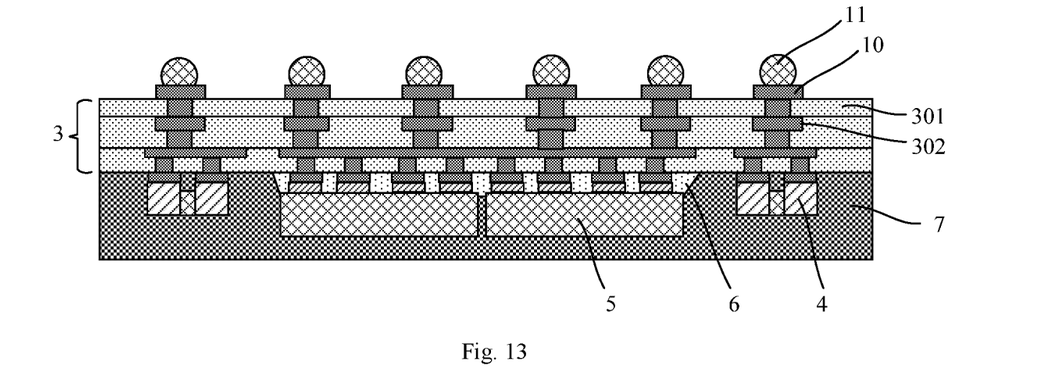
FIG. 13 is a schematic diagram showing a step of removing the second carrier substrate and an adhesion layer in a manner substantially the same the manner of removing the first carrier substrate and the release layer in the method for manufacturing the wafer system-level fan-out packaging structure according to the present disclosure.

For example, as shown in FIG. 13, the second carrier substrate 8 and the adhesion layer 9 are removed in a manner substantially the same as the manner of removing the first carrier substrate 1 and the release layer 2.

Figure 14:
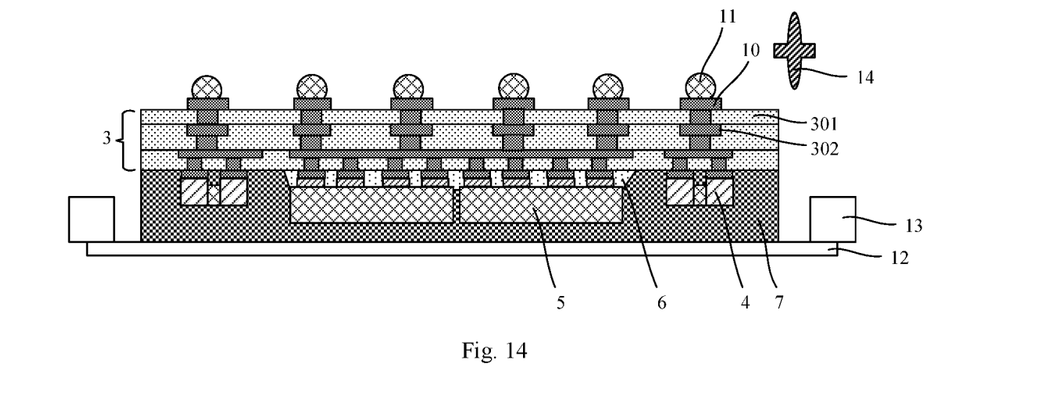
FIG. 14 is a schematic diagram showing a step of trimming the redistribution layer and the plastic packaging layer to obtain a plurality of chips in the method for manufacturing the wafer system-level fan-out packaging structure according to the present disclosure.

For example, as shown in FIG. 14, the redistribution layer 3 and the plastic packaging layer 7 are further cut to obtain a plurality of chips. For example, a blue film 12 may be attached to the back side of the plastic packaging layer 7 and further fixed to the metal frame 13, and then scribed by a blade 14.

In summary, a wafer system-level fan-out packaging structure is obtained. As shown in FIG. 14, the wafer system-level fan-out packaging structure comprises a redistribution layer 3, at least one patch element 4, at least one die 5 having a bump disposed on its front side, and a plastic packaging layer 7. The redistribution layer 3 comprises a first surface and a second surface opposite to each other. The patch element 4 is bonded to the second surface of the redistribution layer 3. The front side of the die 5 is bonded to the second surface of the redistribution layer 3. The plastic packaging layer 7 is located on the second surface of the redistribution layer 3 and covers the patch element 4, the back side and the side surfaces of the die 5. In this embodiment, the packaging structure further comprises an under-bump-metallization layer 10 and a solder bump 11. The under-bump-metallization layer 10 is located on the first surface of the redistribution layer 3, and the solder bump 11 is bonded to the under-bump-metallization layer 10. The packaging structure further comprises an under-fill layer 6. The under-fill layer 6 is located in a gap between the die 5 and the redistribution layer 3. The redistribution layer 3 comprises at least one dielectric layer 301 and at least one metal distribution layer 302 that are stacked in a vertical direction. The patch element 4 of the packaging structure comprises passive elements such as a resistor, an inductor, and a capacitor.

In conclusion, a wafer system-level fan-out packaging structure and the manufacturing method have been described according to the present disclosure, the die and the patch element are packaged in a plastic packaging layer, and the connection and lead-out of the die and the patch element are realized by the redistribution layer. Therefore, the integration level of fan-out functions is increased, the functions and the efficiency of each single chip are enhanced, and the volume of the structure is optimized.

The above embodiments merely exemplarily describe the principles and effects of the present disclosure, instead of limiting the present disclosure. Any person familiar with this technology may make modifications to the above embodiments without departing from the spirit and scope of the present disclosure. Therefore, all equivalent modifications or changes completed by a person with ordinary skill in the art, without departing from the spirit and technical ideas disclosed in the present disclosure, should still fall within the scope of the claims of the present disclosure.

What is claimed is:

1. A method for manufacturing a wafer system-level fan-out packaging structure, comprising:
   providing a first carrier substrate and a release layer on the first carrier substrate;
   forming a redistribution layer, wherein the redistribution layer comprises a first surface and a second surface opposite to each other, wherein the first surface of the redistribution layer is placed on the release layer;
   bonding a patch element to the second surface of the redistribution layer;
   providing a die having a bump disposed on a front side, and bonding the front side of the die to the second surface of the redistribution layer by the bump;
   forming a plastic packaging layer on the second surface of the redistribution layer, wherein the plastic packaging layer covers the patch element, a back side and side surfaces of the die;
   forming a second carrier substrate, wherein the second carrier substrate is bonded to the plastic packaging layer;
   bonding the second carrier substrate to the plastic packaging layer; and
   removing the first carrier substrate and the release layer to expose the first surface of the redistribution layer;
   forming a solder bump on the first surface of the redistribution layer; and
   removing the second carrier substrate.

2. The method for manufacturing the wafer system-level fan-out packaging structure as in claim 1, before removing the second carrier substrate, the method in forming the solder bump further comprising steps of:
   forming an under-bump-metallization layer on the first surface of the redistribution layer; and
   forming the solder bump on the under-bump-metallization layer.

3. The method for manufacturing the wafer system-level fan-out packaging structure as in claim 2, further comprising: cutting the redistribution layer and the plastic packaging layer to obtain a plurality of chips.

4. The method for manufacturing the wafer system-level fan-out packaging structure as in claim 1, further comprising: forming an under-fill layer in a gap between the die and the second surface of the redistribution layer.

5. The method for manufacturing the wafer system-level fan-out packaging structure as in claim 1, wherein the redistribution layer comprises at least one dielectric layer and at least one metal distribution layer that are stacked in a vertical direction.

6. The method for manufacturing the wafer system-level fan-out packaging structure as in claim 1, wherein the patch element comprises an electronic passive element.

7. The wafer system-level fan-out packaging structure manufactured according to claim 1, comprising:
   a redistribution layer, comprising a first surface and a second surface opposite to each other;
   at least one patch element, bonded to the second surface of the redistribution layer;
   a die having a bump disposed on a front side, wherein the front side of the die is bonded to the second surface of the redistribution layer through the bump; and,
   a plastic packaging layer, disposed on the second surface of the redistribution layer wherein the plastic packaging layer covers the at least one patch element, a back side of the die and side surfaces of the die.

8. The wafer system-level fan-out packaging structure as in claim 7, further comprising: an under-bump-metallization layer and a solder bump, wherein the under-bump-metallization layer is located on the first surface of the redistribution layer, and the solder bump is bonded to the under-bump-metallization layer.

9. The wafer system-level fan-out packaging structure as in claim 7, further comprising: an under-fill layer, located in a gap between the die and the second surface of the redistribution layer.

10. The wafer system-level fan-out packaging structure as in claim 7, wherein the redistribution layer comprises at least one dielectric layer and at least one metal distribution layer that are stacked in a vertical direction.

11. The wafer system-level fan-out packaging structure as in claim 7, wherein the at least one patch element comprises an electronic passive element, comprising one of a resistor, an inductor, and a capacitor.

* * * * *